United States Patent [19]

Shutt et al.

[11] Patent Number: 4,598,270
[45] Date of Patent: Jul. 1, 1986

[54] PRECISION INTEGRATING ANALOG-TO-DIGITAL CONVERTER SYSTEM

[75] Inventors: Sidney G. Shutt, Brea; Adrian K. Dorsman, Bellflower, both of Calif.

[73] Assignee: Rockwell International Corporation, El Segundo, Calif.

[21] Appl. No.: 657,647

[22] Filed: Oct. 4, 1984

[51] Int. Cl.[4] .......................................... H03K 13/20
[52] U.S. Cl. ........................... 340/347 NT; 307/257; 324/99 D; 340/347 AD; 340/347 M
[58] Field of Search ................. 340/347 NT, 347 AD, 340/347 M, 347 U; 323/270, 271; 307/257

[56] References Cited

U.S. PATENT DOCUMENTS

| | | | |
|---|---|---|---|
| 3,500,109 | 3/1970 | Sugiyama et al. | 324/99 |
| 3,918,050 | 11/1975 | Dorsman | 340/347 NT X |
| 4,112,428 | 9/1978 | Dorsman | 340/347 NT |

Primary Examiner—T. J. Sloyan
Attorney, Agent, or Firm—H. Fredrick Hamann; S. A. Uchizono; James F. Kirk

[57] ABSTRACT

An analog-to-digital conversion system of the incremental pulse-width modulation type for generating a digital representation of the amplitude of an input analog current to be converted comprising a current integrator, a precision unipolar current source, means for switching current from that source in opposite directions to and from a current summing terminal at the input to the integrator, a timing source, and pulse-width control circuit which controls the means for switching current and which controls a clock signal gating circuit on and off to obtain the output digital representation. The pulse width control circuit utilizes a level shifter which shifts the level of a periodic sawtooth wave of period corresponding to the sampling interval by an amount proportional to the input analog current thereby generating a level-shifted sawtooth wave which is compared with the current integrator's output voltage to control the pulse width of a control signal used to control the means for switching and the clock signal gating circuit to generate the output digital representation.

14 Claims, 18 Drawing Figures

PRECISION INTEGRATING ANALOG-TO-DIGITAL CONVERTER SYSTEM

BACKGROUND OF THE INVENTION

1. Field of the Invention

This invention relates to an analog-to-digital converter of the pulse-width modulation type, and particularly to an incremental pulse width modulation type for generating a digital representation of the amplitude of an input analog current which minimizes offset and time lag errors.

2. Description of the Prior Art

This invention is an improvement over U.S. Pat. No. 3,918,050, entitled "ANALOG-TO-DIGITAL CONVERSION APPARATUS" and U.S. Pat. No. 4,112,428, entitled "CLOCKED PRECISION INTEGRATING ANALOG-TO-DIGITAL CONVERTER SYSTEM", both by A. K. Dorsman, and assigned to the same common assignee. In earlier systems employing integrating analog-to-digital converter systems of the type disclosed in the two patents above-mentioned, such systems were used in strap down accelerometer applications using digitizer (analog-to-digital conversion) circuits. Both velocity accuracy and response time characteristics were adequate to meet the requirements of these less severe acceleration environments. Typically, though sizeable velocity errors did exist, these systems performed adequately. However, in higher accuracy applications the velocity error became significant and to first order was proportional to the integrator voltage at the time of sampling, i.e., at the measurement time. In particular, one of the voltages contributing to the integrator output voltage was either increasing or decreasing in proportion to the input acceleration. A significant velocity error with a time lag was the result.

SUMMARY OF THE INVENTION

It is a major objective of this invention to provide an analog-to-digital converter having improved accuracy. Another object of this invention is to provide an analog-to-digital circuit for digitizing the output from a single axis electromagnetic accelerometer and provide a high accuracy digital representation of that acceleration with minimized velocity errors and time lag. It is another object of this invention to provide a method of converting an analog current to a digital representation with minimized offset errors and good frequency response characteristics.

BRIEF DESCRIPTION OF THE DRAWINGS

These and other objects, features, and advantages of the invention as well as the invention itself, will become more apparent to those skilled in the art in the light of the following detailed description taken in consideration with the accompanying drawings wherein like reference numerals indicate like or corresponding parts through the several views and wherein.

DESCRIPTION OF THE PREFERRED EMBODIMENT

Figure 1:
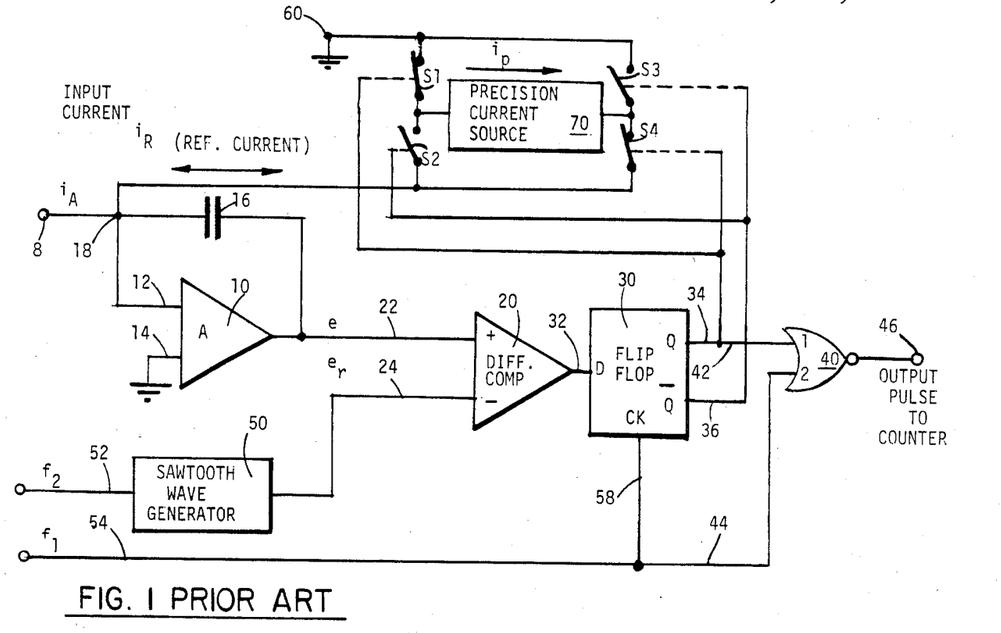
FIG. 1 is a block diagram of the prior art to which the present invention relates.
Figures 2, 2A:
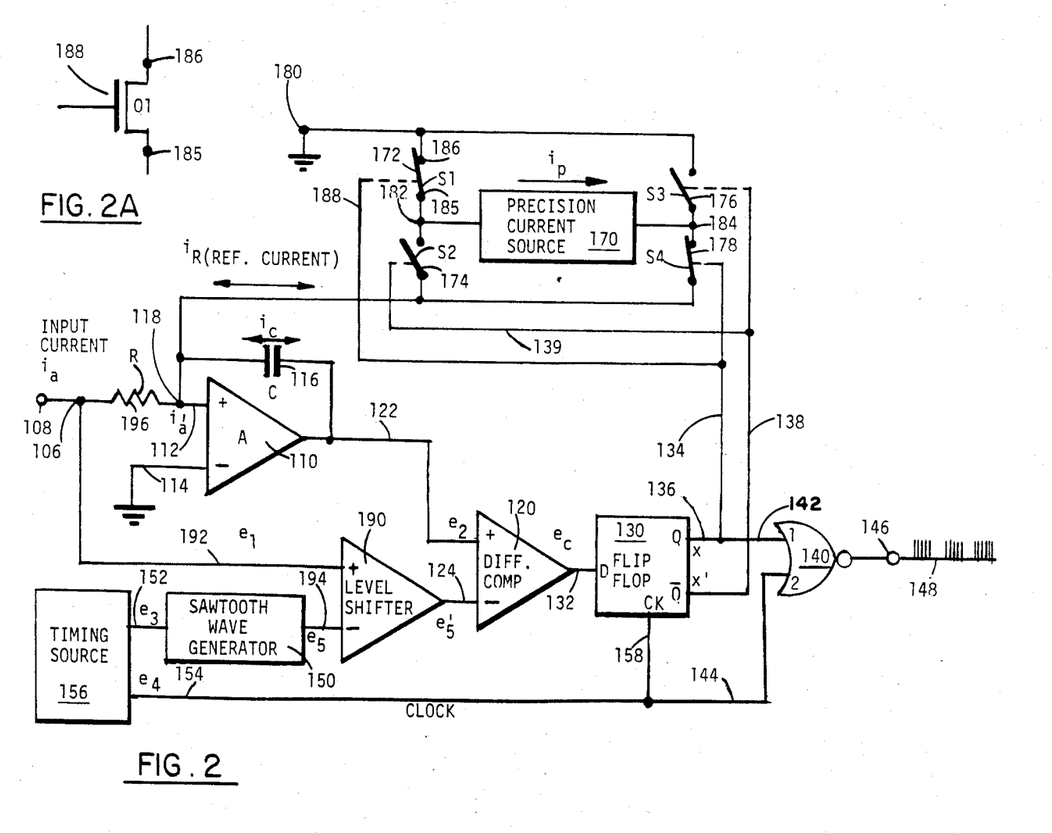
FIG. 2 is a block diagram of a preferred embodiment of the present invention.
FIG. 2a is an optional implementation of one of the detailed features of the block diagram of FIG. 2.

As a brief overview of the distinction between the prior art and the present invention, it is useful to examine the differences between the prior art as shown in FIG. 1 and the present invention as shown in FIG. 2. From this comparison, it can be seen that the primary difference between the two block diagrams is the addition of the resistor R at 196 and level shifter 190 of FIG. 2. Though it is not shown in FIG. 1, a timing source is also used there to generate the signal on leads 52 and 54 at frequencies F2 and F1, respectively. The analogous timing source in FIG. 2 is shown at 156 which generates signals $e_3$ and $e_4$ on leads 152 and 154 of FIG. 2, respectively.

In FIG. 1, the sawtooth wave $e_r$, which comes out of the sawtooth wave generator 50 on lead 24 and is fed to the differential comparator 20, is typically superimposed on a fixed DC level, typically at circuit ground. The signal $e_5$ of FIG. 2 which is analogous to $e_r$ of FIG. 1 is shown on lead 194. Note that this signal $e_5$, is not fed directly into the differential comparator 120. Instead it is first level-shifted by the level-shifter 190 where the amount of level-shifting is proportional to the voltage $e_1$ which is generated by the voltage drop across the resistor 196. In other words, the output of the level shifter $e'_5$ on lead 124 is level-shifted by an amount proportional to the voltage $e_1$ which in turn is proportional to the input current $i_a$ which is input at terminal 108. The signal $e'_5$ is then shown on lead 124 being fed to the negative input of the differential comparator 120. This level shifting of the sawtooth wave signal $e_5$ is the basic distinguishing characteristic of the present invention as distinguished from the prior art of the FIG. 1 block diagram. A complete description of the present invention will now follow.

Figure 3:
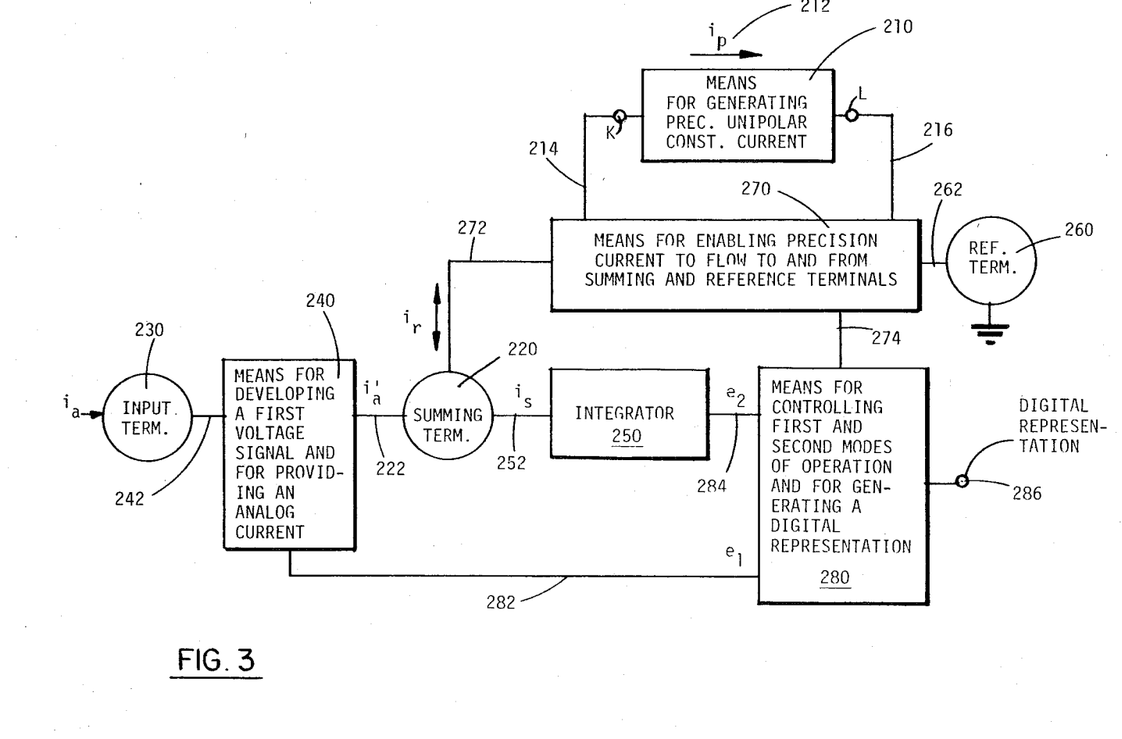
FIG. 3 is another block diagram of an embodiment of the present invention.

Turning now to FIG. 3, there is shown a first preferred embodiment of the present invention. A current source 210 is shown at the top of the block diagram and is identified as Means For Generating Precision Unipolar Constant Current having an input K and an output L. The precision unipolar constant current $i_p$ and its direction are as shown at 212. A summing terminal 220 is shown connected to the block 270 entitled Means For Enabling Precision Current To Flow To And From Summing And Reference Terminals by lead 272 and over which the bidirectional current $i_r$ is conducted. Lead 252 connects the Summing Terminal 220 to the Integrator 250 and conducts the net current entering the summing terminal 220. This current is symbolized by $i_s$. At the input side of the block diagram there is shown an Input Terminal 230 to which is connected the input current $i_a$ which in turn is conducted over lead 242 to the block 240 entitled Means For Developing A First Voltage Signal And For Providing An Analog Current. Typically, the means 240 is a resistive element or a resistor which generates a voltage $e_1$ which is proportional to the current $i_a$ passing through it and going to Summing Terminal 220 over lead 222. The current on lead 222 is identified as $i'_a$. The voltage $e_1$ is fed over lead 282 to the block 280 entitled Means For Controlling First And Second Modes Of Operation And For Generating A Digital Representation. Also, fed from the Integrator 250 to the means 280 is the voltage $e_2$ out of the integrator over lead 284. Lead 274 connects the means 280 to the block 270 entitled Means For Enabling Precision Current To Flow To And From Summing And Reference Terminals. This lead 274 may comprise more than just a single lead and can be a plurality of leads. The output from the means 280 is shown at the terminal 286 and is indicated there as the Digital Representation of the input current $i_a$. Other connections to the means 270 are the lead 262 which connects to the reference terminal 260, typically connected to ground as shown. Means 270 is connected to the current source 210 over lead 214 which connects to the input K of means 210 and lead 216 which connects to the output L of means 210.

In the embodiment of FIG. 3, more specific implementations of certain of the boxes in that diagram can be made. For example, the block 270 entitled Means For Enabling The Precision Current To Flow To And From The Summing And Reference Terminals can be implemented using a bridge array of first and second pairs of switches such as is shown in FIG. 2, where the first pair of switches comprising S1 and S4 enables the precision unipolar current $i_p$ to flow by way of a first path through a first switch S1 of the first pair of switches from the reference terminal 180 here shown connected to ground, through precision current source 170 which corresponds to the means 210 for generating a precision unipolar constant current of FIG. 3, through a second switch S4 of the first pair of switches to the summing terminal shown at 118 of FIG. 2 during the first mode of operation. The terminal 188 is equivalent to Summing Terminal 220 of FIG. 3. The means 210 of FIG. 3 can be implemented as shown in FIG. 2 where the precision current source 170 is connected between terminal 182 which is common to both switches S1 and S2 and terminal 184 which is common to both switches S3 and S4. The second pair of switches comprising switch S2 and S3 of FIG. 2 enables the precision unipolar current $i_p$ to flow by way of the second path through a first switch S2 of the second pair of switches from the summing terminal 118 through the precision current source 170, through a second switch S3 of the second pair of switches to the reference terminal 180 during the second mode of operation.

In a more specific implementation, field effect transistors can be used as the switches S1, S2, S3 and S4. For example, the switch S1 can be implemented as a field effect transistor such as Q1 in the inset drawing of FIG. 2 with the conduction path terminals corresponding to terminals 185 and 186 and the gate control being connected to lead 188 which has the signal x applied to it from the output of the flip-flop 130 via lead 134. The dashed line symbolic of switch control such as through a relay control would then be replaced by a solid connection to the gate of the field effect transistor placed at the position of S1. In similar fashion the other switches S2, S3, and S4 can also be implemented with field effect transistors. The switching function may also be implemented with a double pole - double throw analog switch integrated circuit of either bipolar or field effect transistors, or a combination of both which meets the requirement of this application.

In FIG. 3 the means 280 can be more specifically implemented with reference to FIG. 2 by the combination of the timing source 156 having output $e_3$ connected via lead 152 to the sawtooth wave generator 150, which in turn provides signal $e_5$ on lead 194 to the level shifter 190, which in turn provides the signal $e'_5$ on lead 124 to the negative input of the differential comparator 120. The comparison signal $e_c$ from the output of the differential comparator 120 is provided to the D input of the flip-flop 130 over lead 132. The clock signal corresponding to $e_4$ from the timing source 156 on lead 154 is applied to the clock input CK of flip-flop 130 via lead 158. The output x on lead 136 from the flip-flop is connected to an output circuit shown here as gate 140 which has a first and second input on leads 142 and 144 respectively, and having an output terminal 146. At the output terminal 146, there is a characterization 148 of a typical output from the gate 140 which shows an on-off modulated output pulse train where each group of pulses is output according to the gating signal which appears on lead 142 which gates the clock signal appearing on the second input 144 through the gate 140 to the output 146.

Additionally, note that x' is used to control switches S2 and S3 via lead 138 and 139 and x is used to control S1 and S4 via leads 136, 134, and 188. Elsewhere herein, the sawtooth wave generator 150, the level shifter 190, the differential comparator 120, the flip-flop 130, and the gate 140, and the innerconnections thereinbetween are referred to collectively as a first means responsive to the first and second voltage signals $e_1$ and $e_2$, the clock signal $e_4$, and the reference signal $e_3$, which are coupled to the enabling means 270 of FIG. 3 for controlling the first and second modes of operation of the enabling means and for generating the digital representation of the amplitude of the input analog current $i_a$ characterized by the output pulse train 148 shown at the output terminal 146.

The first means referred to above can be further broken down into two major circuits, an incremental pulse width modulation circuit and an output circuit. The incremental pulse width modulation circuit is responsive to the first and second voltage signals $e_1$ and $e_2$, the clock signal $e_4$ and the reference signal $e_3$, and is used for generating the first and second complementary signals and x and x' to control the first and second modes of operation of the enabling means 270. This incremental pulse width modulation circuit can be comprised of the following boxes of FIG. 2: sawtooth wave generator 150, level shifter 190, differential comparator 120, and flip-flop 130, and the interconnections thereinbetween. The output circuit which is responsive to the x output as shown in FIG. 2 and to the clock signal $e_4$ and which is used to generate a digital representation of the amplitude of the input analog current $i_a$ is shown as the gate 140. In the pulse width modulation circuit, the sawtooth wave generator 150 is shown responsive to the signal $e_3$ which is a reference signal for developing a preselected signal waveform, typically a sawtooth wave. The signal $e_3$ is shown coming from the timing source 156 on lead 152. The level shifter 190 is responsive to both $e_1$ and $e_5$, $e_1$ coming from node 106 on the input side of the resistor 196 via lead 192 and the signal $e_5$ coming from the sawtooth wave generator 150 on lead 194. The output from $e'_5$ will be a replica of the input $e_5$ with the exception that there will be a shift in level of the waveform $e_5$ by an amount proportional to the amplitude of the signal $e_1$.

The output signal $e'_5$ is fed to the negative input of the differential comparator 120 on lead 124 and is compared with the signal $e_2$ from the amplifier 110 and the capacitor 116, which together comprise an integrator the output of which is fed to the positive input of the differential comparator 120 on lead 122. The differential comparator 120 develops a comparison signal $e_c$ at its output on lead 132. Signal $e_c$ is in a first binary state when $e_2$ is greater than $e'_5$ and in a second binary state when $e_2$ is less than $e'_5$. The last portion of the pulse width modulation circuit is the flip-flop 130 which has a "D", "CK", "Q", and "$\overline{Q}$" terminals. The output signals x and x' are provided at Q and $\overline{Q}$ and are present on the output leads 136 and 138, respectively. In FIG. 2 the x output is shown fed to the output circuit, in this case gate 140, over leads 136 and 142.

The gating circuit 140 has inputs 1 and 2 which are connected to external circuitry through leads 142 and 144, respectively. An output is provided on terminal 146. The function of the gating circuit 140 is to allow the clock pulses which are coming to input 2 from the timing source on lead 154 and 144 to be gated to the output in accordance with the polarity of the signal x, thereby allowing the clock pulses to be passed to or blocked from the output 146 in accordance with the signal which appears at input 1 on lead 142 from the flip-flop 130. The output pulse train indicated at 148 is therefore a digital representation of the amplitude of the input analog current. A further processing of this signal can be accomplished by coupling it to a means for developing a digital output indication of the amplitude of the input analog current, for example, by providing it either to a computer for use or connecting it to a pulse counter to drive a digital display.

Figure 4:
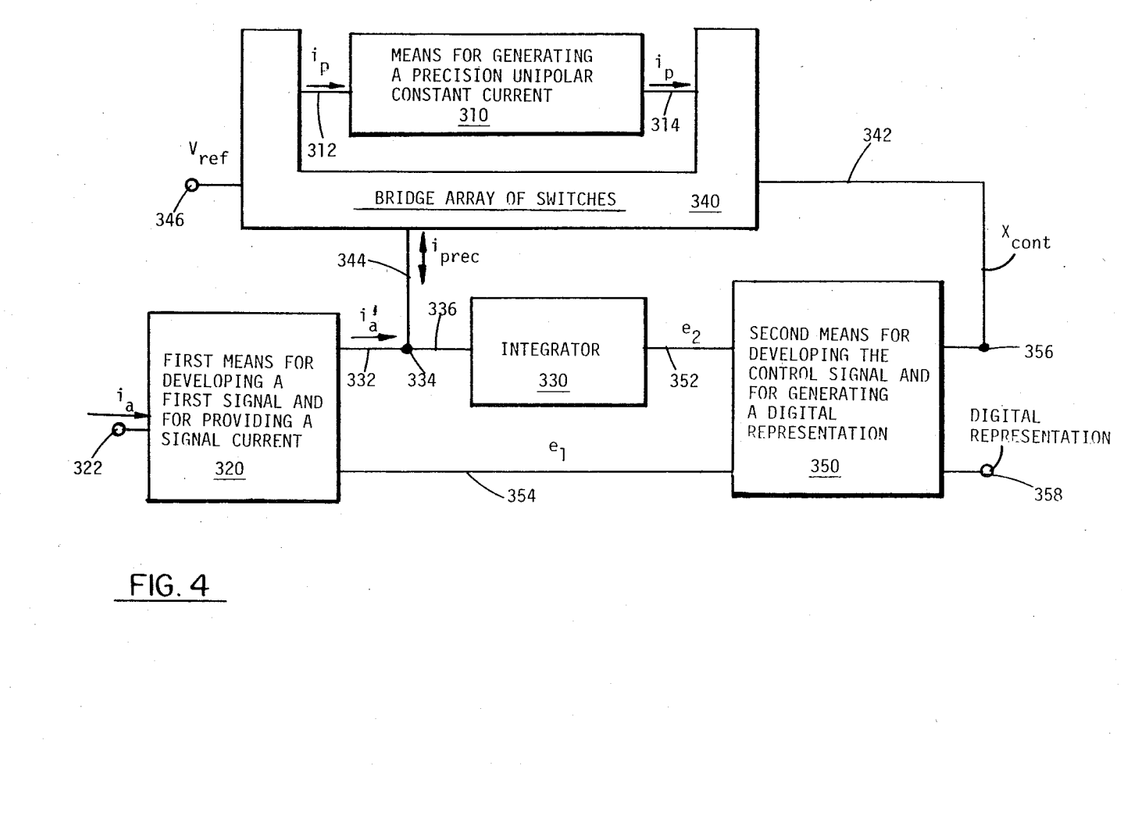
FIG. 4 is a block diagram of another embodiment of the present invention.

Another embodiment of the present invention is shown in the block diagram of FIG. 4. There is shown an analog-to-digital converter comprising the following elements: a first means 320 is shown for developing a first signal $e_1$ which is proportional to an input analog current $i_a$ shown being inputted at terminal 322 and also for providing a signal current $i'_a$ on lead 332 to node 334 which is substantially equal to the input analog current $i_a$. Also shown is a means 310 for generating a precision unipolar constant current $i_p$ which is shown both entering the block 310 on lead 312 and leaving block 310 on lead 314.

The integrator is shown at 330 with the input connected to the node 334 by lead 336. The integrator 330 generates a second signal $e_2$ which is proportional to the negative integral of the sum of currents flowing through the node 334 to the input of the integrator through lead 336. The integrator output signal $e_2$ appears on lead 352.

Bridge array 340 of switches is controlled by a control signal $x_{cont}$ shown on line 342 coming from second means 350 where the switches are used for enabling the precision unipolar constant current $i_p$ to flow by way of a first direction from the reference potential $V_{ref}$ at 346 through the bridge array 340 and generating means 310 to the node 334 connected to the input of the integrator 330 by lead 336 during presence of a first binary voltage level of the control signal $x_{cont}$. Conversely, the current $i_p$ is made to flow by way of a second direction from the node 334 through the bridge array 340 and generating means 310 to the reference potential $V_{ref}$ at 346 during presence of the second binary voltage level of the control signal $x_{cont}$.

Second means 350 is responsive to the first and second signals, $e_1$ and $e_2$, on leads 352 and 354, respectively, and is used for developing the control signal $x_{cont}$ having first and second binary voltage levels as a function of the amplitude of the input analog current $i_a$. The second means 350 also generates a digital representation of $i_a$ and provides it at terminal 358.

Figure 5:
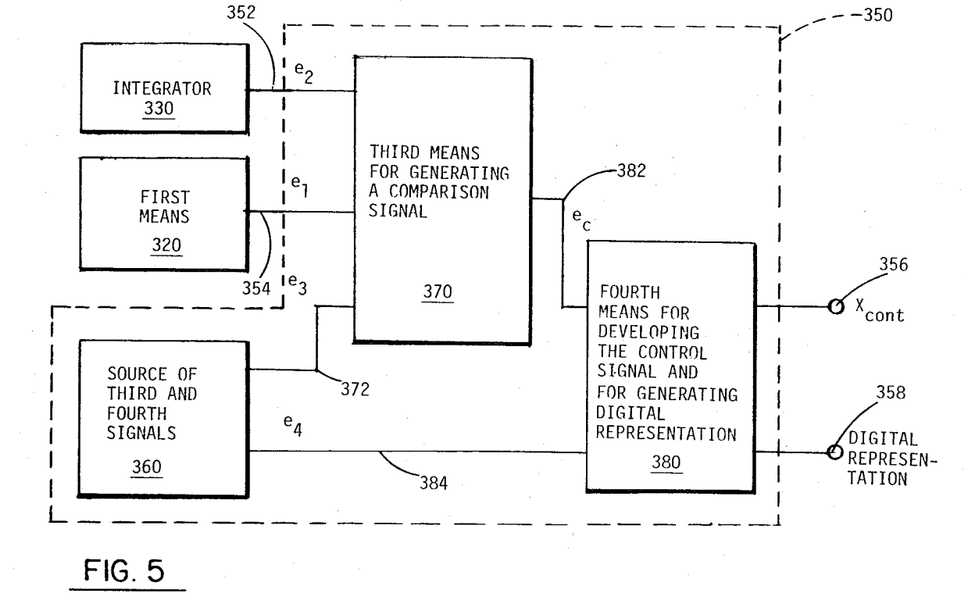
FIG. 5 is a portion of the block diagram of FIG. 4, showing additional details of that preferred embodiment.

Further details of second means 350 of FIG. 4 are provided in FIG. 5 where the second means is shown comprising a source 360 of third signal $e_3$ on line 372 and fourth signal $e_4$ on line 384. Signal $e_3$ goes to a third means 370 for generating a comparison signal by way of lead 372. Third means 370 is responsive to the first signal $e_1$ on line 354, second signal $e_2$ on line 352, and third signal $e_3$ on line 372. Third means 370 generates the comparison signal $e_c$ on lead 382. Fourth means 380, to which the comparison signal $e_c$ is fed by way of lead 382, is used for developing the control signal $x_{cont}$ which is output on terminal 356. The fourth means also generates a digital representation of the amplitude of the input analog current $i_a$ of FIG. 4, where this representation is presented at terminal 358.

Details of third means 370 comprise a sawtooth wave generator, a level shifter, and a comparator such as is shown in FIG. 2 at 150, 190, and 120, respectively. These three blocks, in general, function in a manner identical to that in which they function in accordance with FIG. 2. Also, the fourth means 380 of FIG. 5, can be further divided into two blocks, one comprising a flip-flop clocked by the fourth signal $e_4$ for the purpose of generating the complementary first and second control signals to control the operation of the plurality of switches of the bridge array of switches in 340 and for selectively enabling the gating means similar to that shown at 140 of FIG. 2 to pass portions of the clock signal $e_4$ to the gate output as a function of the amplitude of the input current $i_a$.

PRINCIPLES OF OPERATION

The operation of the present invention, as exemplified by the block diagram of FIG. 2, is conveniently explained by referring to the principles of operation of the existing prior art as exemplified by the block diagram of FIG. 1. Referring to FIG. 1, a sawtooth wave signal $e_r(t)$ on lead 24 is compared to the signal $e(t)$ on lead 22 to the differential comparator 20. In FIG. 6b, there is shown a typical time history of these two signals, where $e_r(t)$ is shown by curve 602 and the signal $e(t)$ is shown by curve 604.

In FIG. 6a, there is shown a typical waveform of the current input to the integrator, which with reference to FIG. 1 is the sum of the currents $i_A$ and $i_R$ entering the node 18. With the switches S1 and S4 closed as shown, the current $i_p$ will move from the reference terminal 60 through the switch S1, through the precision current source 70, through the switch S4 to the node 18 to combine there with the input current $i_A$ which is introduced via the input terminal 8. So long as the switches S1 and S4 remain closed, switches S2 and S3 remain open, and the input analog current $i_A$ remains relatively constant, the current will be as shown in FIG. 6a until such time as the switches S1 and S4 open and concurrently switches S2 and S3 are closed. This will occur when the outputs from the flip-flop 30 are inverted on the lines 34 and 36 which control the switches S1 through S4. The flip-flop outputs will change state when there has been a change of state at the D input to the flip-flop on lead 32 concurrently with the rising edge of the clock on 158. In turn, the state of the signal at D will reflect the relative amplitudes of the signals e on lead 22 and $e_r$ on lead 24.

Figure 6:
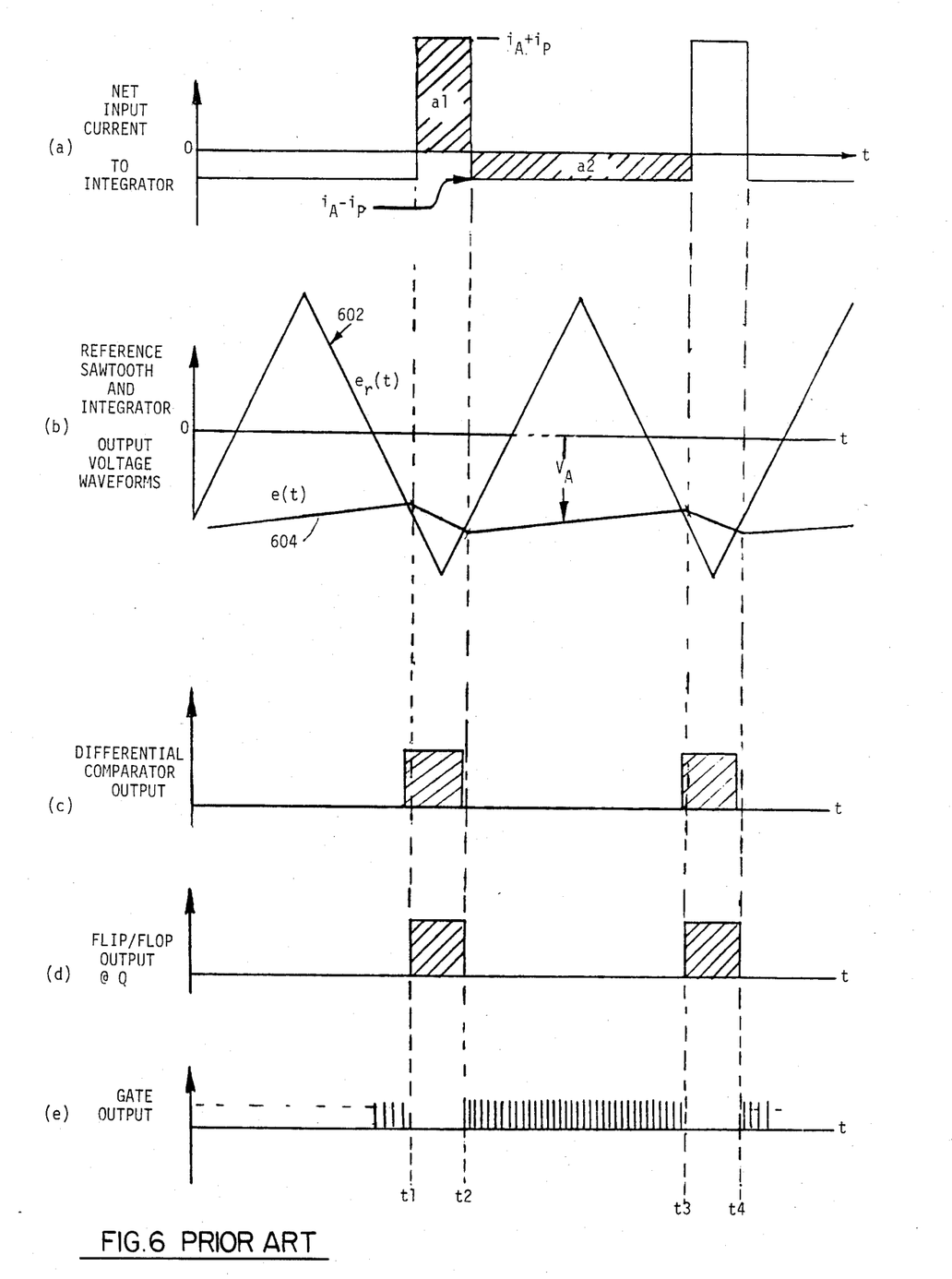
FIGS. 6a–e are diagrams of waveforms showing the relationship of several of the signals which are generated by prior art analog-to-digital converter systems of a type presented in the block diagram of FIG. 1.

During the time period between t1 and t2 of FIG. 6, the voltage $e_r$ is shown to be more negative than the voltage e, and during this period the current input to the integrator is positive and equal to $i_A + i_p$. This is integrated and results in a negative slope of e(t) which eventually causes e(t) to become more negative than reference $e_r(t)$. At time $t_2$ when the sawtooth wave voltage, represented by curve 602 in FIG. 6b, becomes more positive than the signal coming out of the integrator represented by curve 604, the differential comparator 20 will change the state of the signal on lead 32 which in turn causes the flip-flop 30 to change state. This causes the switches S1 and S4 to open and switches S2 and S3 to close causing the current flow represented by $i_R$ to change the direction of its flow relative to the summing node 18. More specifically, with switches S1 and S4 open and switches S2 and S3 closed, the current $i_R$ will leave the summing node 18 and travel through switch S2, through the precision current source 70, through the switch S3 to the reference terminal 60. Relative to the current $i_R$, this represents a reversal of the current along that current path and away from summing node 18.

This reversal of current is shown in FIG. 6a where the current at $t_2$ reverses its polarity and drops to a negative amplitude corresponding to the hatched in area $a_2$. During this time period then, current $i_R$ is moving away from node 18 and according to the example shown here is greater than the amplitude of $i_A$ coming in to the node 18 causing a positive slope of the voltage curve e(t) until time $t_3$ when $e_r$ is once again more negative than the signal e.

At $t_3$ the output of the differential comparator 20 on lead 32 reverses polarity causing the flip-flop 30 to once again change state. This in turn causes the switches to change once again with S1 and S4 being closed and switches S2 and S3 being opened, whereupon current $i_R$ reverses its direction once again causing a net positive current inflow into the amplifier 10. As is shown in FIG. 6a, the net current input becomes positive. In order that the average current into the integrator and out of the integrator over a complete cycle comprising the time interval t1 minus t2 be equal to zero, the two areas $a_1$ and $a_2$ must be equal to each other. Were this not the case, an error in the net current results and causes the average signal level corresponding to $V_A$ in FIG. 6b to shift which readjusts the relative time of periods t1 to t2 to t3, which in turn corrects the error condition and $a_1$ and $a_2$ become equal again.

The output gate 40 is controlled by the Q output from the flip-flop. The Q signal gates the clock pulses at frequency $f_1$ coming via leads 54 and 44 to the input 2 of gate 40 to cause those pulses to be gated to the output 46 of the output gate. These pulses are as shown in FIG. 6e controlled by the flip-flop 30 in much the same way that the polarity of the current is switched in FIG. 6a. The clock signal at frequency $f_1$ is gated to the output terminal 46 by the gating signal on lead 42 entering terminal 1. For a constant frequency $f_1$, then the number of pulses which are gated to the output will be a function of the ratio of input current to the precision current, $i_p$. It can be shown that the number of pulses gated in period $t_1$ to $t_3$ is given by $N_O = \frac{1}{2}((i_A/i_p)+1)N_1$, where $N_1$ is the total clock pulses on 134 during $t_1$ to $t_3$. Note that measurable input currents must not exceed $i_p$ in absolute value. As the input current drops closer to the zero level, the period from $t_1$ to $t_2$ approaches the interval length from $t_2$ to $t_3$ resulting in a symmetrical control signal to the gate 40 and a 50% duty cycle of the pulses at the output of the gate on terminal 46.

Figure 7:
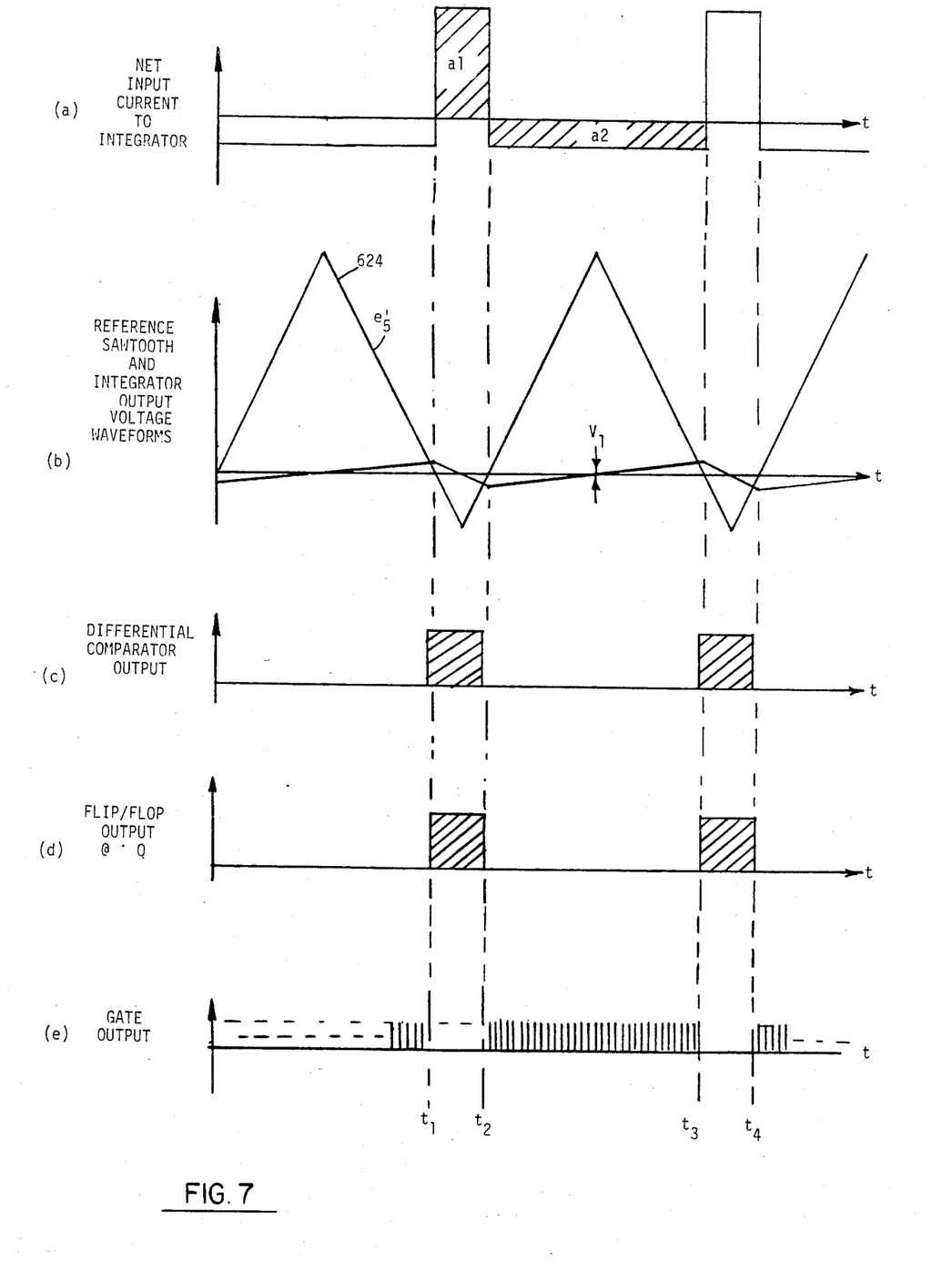
FIGS. 7a–e show several wave forms corresponding to the signals which are generated by the present invention and show the nature of the signals when compared against the system of FIG. 6.

In FIG. 7, there is shown the waveform signals corresponding to the block diagram of the present invention of FIG. 2. Note that the essential difference between the two waveform representations is in FIGS. 6b and 7b. Note particularly that the implementation of the block diagram of FIG. 2 with waveforms as represented by FIG. 7b enables the average value of the integrator output $e_2(t)$ to stabilize around the zero voltage level. By contrast, in FIG. 6b, note that the average value of the integrator output e(t) stabilizes around the value $V_A$. The waveforms FIG. 7b are brought about by the mechanization shown in FIG. 2 where the output $e_5$ from the sawtooth wave generator 150 on line 194 is first input to a level shifter 190 which shifts the level of the sawtooth wave generator by amount which is proportional to the input current $i_a$ shown input at terminal 108. The output $e'_5$ on lead 124 from the level shifter 190 is therefore a level shifted version of the sawtooth wave output $e_5$ from the sawtooth wave generator 150. The signal $e'_5$ is indicated in FIG. 7b and is identified as curve 624. Comparing FIG. 7a with FIG. 6a, it is seen that for the steady state condition to which both FIG. 6 and FIG. 7 pertain, the current input to the integrator behaves in substantially identical fashion in the circuit of FIG. 2 as it does in the circuit of FIG. 1 insofar as the length of the gating signal fed to gate 140 is concerned. This is evidenced by the appearance of the waveforms of FIGS. 6e and 7e where substantially the same pulse patterns are shown. Once again, it is pointed out that this is the condition which obtains when the input current is at a steady state value.

Figure 8:
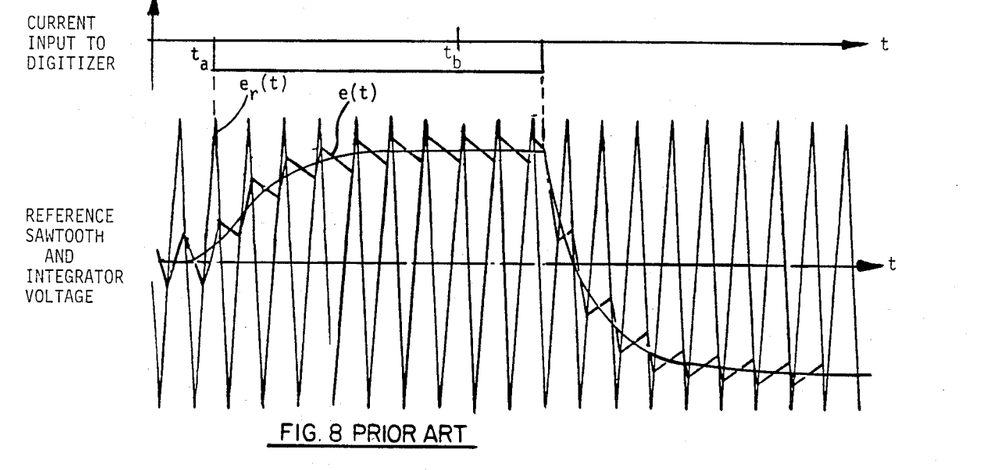
FIG. 8 shows signal waveforms corresponding to the transient behavior of the analog-to-digital converter system of the type shown in FIG. 1.
Figure 9:
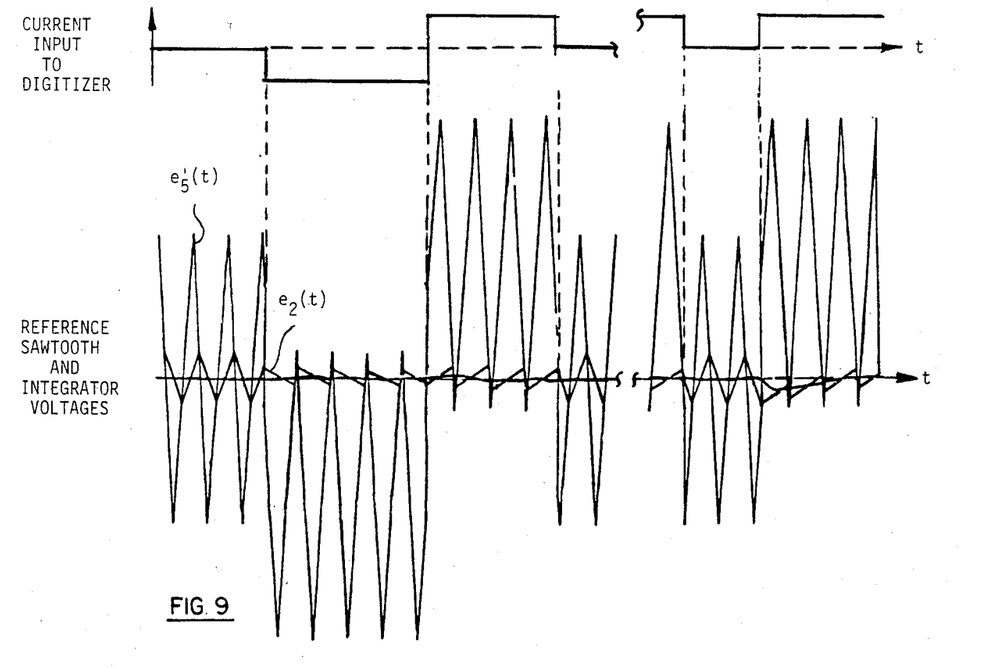
FIG. 9 shows signal waveforms corresponding to the transient behavior of the converter system of the present invention.

Let us now examine the condition of the time interval between $t_1$ and $t_2$ under transient input current conditions. For this purpose we refer to the FIGS. 8 and 9 which show the contrasting characteristics of the critical signals represented there. In FIGS. 8 and 9, the upper diagram of each figure is a representation of a step current input to the respective circuits of FIG. 1 and FIG. 2. Relative to FIG. 1 this waveform corresponds to the current $i_A$ and with reference to FIG. 9 represents the input current $i_a$. The bottom diagram of FIG. 8 and FIG. 9 corresponds to the voltage plots of both the sawtooth wave signal and integrator voltages respectively of the two configurations. These waveforms are of the type presented in the diagrams of FIGS. 6b and 7b, respectively, with a compressed time scale to permit illustration of the transient response of the two different configurations. Note that in the lower diagram of FIG. 8 during the transient portion between approximately $t_a$ and $t_b$, the time interval for which the sawtooth wave $e_r(t)$ of FIG. 1 is positive with respect to the integrator waveform corresponding to the time interval $t_2$ minus $t_1$ of FIG. 6 is large during the initial portions of the transient response relative to the corresponding time interval during steady state, for example after the time $t_b$. This delay is caused by the time required to charge the integrator capacitor to voltage $V_A$.

Referring back to the middle diagram of FIG. 6, this would mean that there would be a tendency for the area $a_1$ to have an increased time base, to be wider in effect, such that in order that the $a_2$ area could then balance it out during the remainder of the cycle the amplitude of the $a_2$ portion would also have to be increased, thereby introducing an error in the current. For each of the sawtooth wave cycles taken to reach a steady state condition then a slight amount of error is added or accumulates in the final integrated value to reach the steady state condition. This manifests itself as an error in the end value of voltage which is reached or which is stored on the capacitor. During the transient period then the area $a_1$ being broader than it should be to give an accurate representation causes the digital output gate period to be narrower than it should be and therefore introduces an error in the output pulse count from terminal 46 which adds to the accumulated pulse count error if taken over the entire transient period.

By comparison, FIG. 9 presents the transient characteristics of the present invention in the lower diagram of FIG. 9 in response to the stepped current input shown in the upper diagram of FIG. 9. Note specifically that because of the introduction of the level shifter with the voltage shifted by an amount proportional to the voltage $e_1$ on lead 192 of FIG. 2, that immediately upon a shift of input current the sawtooth wave generator output is shifted downward as shown in the bottom diagram of FIG. 9. Note also that during the first intersection of the sawtooth wave and the integrator output that the time period corresponding to $t_2$ minus $t_1$ has immediately assumed a value close to the steady state value as shown in FIG. 8. The pulse widths of areas $a_1$ and $a_2$ are now directly affected by the step in input current. The net input current of the steady state condition obtains without the delay which would have obtained in the circuit of FIG. 1.

In the circuit of FIG. 1, pulse width action reouires the integrator voltage to shift relative to a fixed sawtooth wave, whereas the circuit of FIG. $2_1$ shifts the sawtooth with respect to a relatively constant integrator voltage. The former is slow due to the long time constant delay of the integrator, the latter is fast because the delay of the level shifter is neglegible. Basically then, the present invention allows immediate response to step inputs thereby minimizing the buildup of cumulative voltage errors corresponding to each of the measurement cycles during what would be a transient period time interval for the prior art configuration of FIG. 1. This then is the basic principle of operation of the present invention illustrating both the improvement in error reduction as well as the improvement in time response of the system to step inputs of current.

In applications where the current is taken from an accelerometer, for example, the typical accelerometer will provide a current with output $i_a$ which is proportional to the acceleration of the transducer. Under such conditions then, the ultimate error in voltage which manifest itself as an error in the pulse count out of the gate 140 will then manifest itself as a error in velocity since the integration of current resulting in an accumulated charge on the integrator capacitor 116 represents an equivalent stored velocity which has not been transmitted via the output gate. Therefore, in such an application, the need for quick response to step inputs would be related to the necessity for a system to be responsive to step inputs of acceleration. The present invention is particularly adapted to accurately measure such step inputs of acceleration and do so in a very accurate manner.

Although the invention has been described and illustrated in detail, it is clearly understood that the same is by way of illustration and example only and is not to be taken by way of limitation, the spirit and scope of this invention being limited only by the terms of the appended claims.

We claim:

1. An analog-to-digital conversion system comprising:

means for generating a precision unipolar constant current;

a summing terminal for receiving an analog current;

an input terminal for receiving an input analog current;

means coupled to said summing and input terminals for developing a first voltage signal proportional to said input analog current and for providing an analog current to said summing terminal substantially equal to said input analog current;

an integrator, coupled to said summing terminal, for generating a second voltage signal proportional to the integral of the sum of currents flowing through said summing terminal;

a reference terminal at a reference potential, such as ground;

means for enabling the precision unipolar current to flow by way of a first direction through said enabling means from said reference terminal through said generating means to said summing terminal during a first mode of operation and to flow by way of a second direction through said enabling means from said summing terminal through said generating means to said reference terminal during a second mode of operation;

a timing source for developing a reference signal and a clock signal;

a generator responsive to the reference signal for developing a sawtooth wave signal;

a level shifter responsive to said first voltage signal and to said sawtooth wave signal for developing a shifted signal by shifting the level of said sawtooth signal by an amount proportional to the amplitude of said first voltage signal;

a comparator for developing a comparison signal in response to said second voltage signal and said shifted signal, said comparison signal being in a first binary state when said second voltage signal is in a first polarity relationship with respect to said shifted signal and in a second binary state when said second voltage signal is in a second polarity relationship with respect to said shifted signal;

a flip-flop responsive to said comparison signal and said clock signal for developing said first and second complementary signals, said first and second complementary signals controlling said first and second modes of operation of said enabling means; and an output circuit responsive to a preselected one of the first and second complementary signals and to the clock signal for generating the digital representation of the amplitude of the input analog current.

2. The system of claim 1 wherein said developing and providing means comprises a resistor connected between said input and summing terminals whereby said second voltage signal is provided at the input terminal.

3. The system of Claim 1 wherein said enabling means comprises:
   a bridge array of first and second pairs of switches coupled to said means for generating a precision unipolar constant current;
   said first pair of switches enabling the precision unipolar current to flow by way of a first path through a first switch of said first pair of switches from said reference terminal through said means for generating a precision unipolar constant current, through a second switch of said first pair of switches to said summing terminal during said first mode of operation;
   said second pair of switches enabling the precision unipolar current to flow by way of a second path through a first switch of said second pair of switches from said summing terminal through said means for generating a precision unipolar constant current, through a second switch of said second pair of switches to said reference terminal during said second mode of operation.

4. The system of claim 3 wherein each of the switches in the bridge array of first and second pairs of switches is a field effect transistor.

5. A method of converting an analog current to a digital representation, comprising the steps of:
   receiving an input analog current at an input terminal;
   developing a first voltage signal proportional to said input analog current;
   providing an analog current substantially equal to said input analog current at a summing terminal for receiving analog currents;
   generating a precision unipolar constant current;
   generating a second voltage signal proportional to the integral of the sum of the precision unipolar and analog currents flowing through said summing terminal;
   enabling the precision unipolar current to flow by way of a first direction from a reference terminal through means generating said precision unipolar constant current to said summing terminal during a first mode of operation and to flow by way of a second direction from said summing terminal through said means for generating a precision unipolar current to said reference terminal during a second mode of operation;
   developing a control signal as a function of the amplitude of the input analog current to control said first and second modes of operation of said enabling means in response to said first and second voltage signals by:
   generating a sawtooth wave signal;
   shifting the level of said sawtooth wave signal so generated by an amount proportional to the amplitude of said first signal thereby producing a level-shifted sawtooth wave signal;
   comparing the second signal from the integrator and the level shifted sawtooth wave signal for generating a comparison signal;
   driving a flip-flop responsive to the comparison signal and to a clock signal for precisely developing the control signal as a function of the amplitude of the input analog current;
   controlling a gate circuit with the outputs of and flip-flop to pass said clock signals;
   generating a digital representation of the amplitude of the input analog current by accumulating said clock signals passed by said gate circuit, the accumulation of said passed clock signals being digitally representative of the amplitude of the input analog current.

6. A method of converting an analog signal to a digital signal comprising the steps of:
   generating a precision unipolar constant current;
   developing a first signal proportional to an input analog current;
   providing a signal current substantially equal to said input analog current;
   generating a second signal proportional to the integral of the sum of said signal and precision unipolar currents;
   developing a control signal having first and second voltage levels as a function of the amplitude of the input analog current by:
   generating a sawtooth wave signal;
   shifting the level of said sawtooth wave signal so generated by an amount proportional to the amplitude of said first signal thereby producing a level-shifted sawtooth wave signal;
   comparing the second signal from the integrator and the level-shifted sawtooth wave signal for generating a comparison signal;
   driving a flip-flop responsive to the comparison signal and to a clock signal for precisely developing the control signal as a function of the amplitude of the input analog current;
   controlling a bridge array of switches with said control signal and enabling the precision unipolar constant current to flow by way of a first direction through said bridge array of switches from a reference potential through to said input of the integrator during presence of the first voltage level of the control signal and to flow by way of a second direction through said bridge array of switches from said input of the integrator to the reference potential during presence of the second voltage level of the control signal; and
   controlling a gate circuit with the output of said flip-flop to pass said clock signals, the clock signals passed being accumulated to digitally represent the amplitude of the input analog current.

7. An analog-to-digital converter comprising:
   an input terminal for receiving an input analog current;
   a summing terminal for receiving analog currents;
   a resistor connected between said input and summing terminals for developing a first voltage signal proportional to said input analog current;
   a source of precision current having source input and output terminals;
   first and second switches, said first switch connected between said source input terminal and a reference terminal, said second switch connected between said source output terminal and the summing terminal, said first and second switches being enabled by a first control signal to allow the precision current to flow from the reference terminal through said first switch, said source, and said second switch to said summing terminal;
   third and fourth switches, said third switch connected between said source input terminal and said summing terminal, said fourth switch connected between said source output terminal and the reference terminal, said third and fourth switches being enabled by a second control signal to allow the precision current to flow from the summing terminal through said third switch, said source, and said fourth switch to the reference terminal;

an integrator for generating a second voltage signal proportional to the integral of the sum of the precision and analog currents flowing to and from said summing terminal;

a timing source for developing first and second clock signals;

a generator responsive to the first clock signal for generating a reference voltage signal of a preselected periodic waveshape;

a level shifter responsive to said first voltage signal and said reference voltage signal for shifting the level of said reference voltage signal by an amount proportional to said first voltage signal and thereby developing a level-shifted reference voltage signal;

a voltage comparator responsive to the level-shifted reference and second voltage signals for developing a comparison signal;

a flip-flop responsive to the comparison signal and the second clock signal for generating the first and second control signals as a function of the amplitude of the input analog current; and gating means having an output terminal responsive to a preselected one of the first and second control signals and to the second clock signal for passing a digital representation of the amplitude of the analog current to said gating means output terminal.

8. The system of claim 1 wherein said output circuit comprises:
a gating circuit having an output terminal responsive to at least one of the first and second complementary signals for gating the clock signal to said output terminal during one of said modes of operation and for blocking the clock signal during the other of said modes of operation to generate the digital representation of the amplitude of the input analog current.

9. The system of claim 8 further including means coupled to the output terminal of said gating circuit for developing a digital output indication of the amplitude of the input analog current.

10. An analog-to-digital converter comprising:
means for generating a precision unipolar constant current;
first means for developing a first signal proportional to an input analog current and for providing a signal current substantially equal to said input analog current;
an integrator coupled to said first means and having an input, said integrator generating a second signal proportional to the integral of the sum of currents flowing through said integrator input;
second means responsive to the first and second signals for developing a control signal having first and second voltage levels as a function of the amplitude of the input analog current and for generating a digital representation of the amplitude of the input analog current; said second means for developing the control signal having:
a source of third and fourth signals said third and fourth signals being periodic clock synchronized clock signals having first and second states, the frequency of said fourth signal being a high multiple of said third signal;

third means responsive to the first, second, and third signals for generating a comparison signal, said third means having:
a generator responsive to the third signal for developing a sawtooth wave signal;
means responsive to said sawtooth wave signal and said first signal for shifting the level of said sawtooth wave signal by an amount proportional to the amplitude of said first signal to thereby produce a level-shifted sawtooth wave signal; and
a comparator responsive to the second signal and the level shifted sawtooth wave signal for generating the comparison signal;
a bridge array of switches controlled by said control signal for enabling the precision unipolar constant current to flow by way of a first direction through said bridge array of switches from a reference potential through said generating means to said input of said integrator during presence of the first voltage level of the control signal, and to flow by way of a second direction through said bridge array of switches from said input of said integrator through said generating means to the reference potential during presence of the second voltage level of the control signal.

11. The converter of Claim 11 wherein said fourth means comprises:
a flip-flop responsive to the comparison signal and to said fourth signal for precisely developing the control signal as a function of the amplitude of the input analog current; and
a gate circuit controlled by said flip-flop to gate said fourth signal to produce a digital representation of the amplitude of the input analog current.

12. An analog-to-digital converter comprising:
a reference terminal;
a resistor having first and second terminals, said first terminal for receiving an input analog current, said resistor developing a first voltage signal proportional to said input analog current and providing said input analog current at said second terminal;
a source of precision constant current having source input and output terminals with the precision current flowing between said source input and output terminals;
an integrator for generating a second voltage signal, which ramps up and down, and having a summing terminal connected to the second terminal of said resistor for receiving an analog current substantially equal to said input analog current, said integrator being responsive to the sum of the input analog current and to the precision current, which is controlled to alternately flow to and from said summing terminal;
control means responsive to the first and second voltage signals for developing first and second binary control signals, said control means having:
a first means for developing first and second clock signals;
a second means responsive to said first and second voltage signals for developing a comparison signal having first and second states; said second means having;
a generator for developing a period reference waveform;
a level-shifter responsive to said first voltage signal and said periodic reference waveform for developing a level-shifted periodic reference waveform by shifting the level of said reference waveform by an amount proportional to said first voltage signal; and a comparator responsive to the level-shifted reference waveform and the second voltage signal for developing the first and second states of the comparison signal as a function of the relative voltage levels of the level-shifted reference waveform and the second voltage signal;

a plurality of switches selectively coupled to said source, said plurality of switches being responsive to said first binary control signal having logic "one" and "zero" states for switching the direction of flow of the precision current from said source to said summing terminal during occurrence of the logic "one" state of said first binary control signal and being responsive to said second binary control signal having logic "one" and "zero" states for swtiching the direction of flow of the precision current from said summing terminal to said source during occurrence of the logic "one" state of said second binary control signal, said plurality of switches being arranged to form a bridge array of first, seconds, third and fourth switches, said second and fourth switches being connected between said input and output terminals of said source, respectively, and the summing terminal, and said first and third switches being connected between said input and output terminals of said source, respectively, and said reference terminal, said second and third switches being rendered conductive by the logic "one" state only of the first binary control signal, and said first and fourth switches being rendered conductive by the logic "one" state only of the second binary control signal.

13. The converter of claim 12 wherein:
said generator develops the reference waveform in synchronization with the first clock signal and at a frequency which is an integral submultiple of the frequency of the second clock signal.

14. The converter of claim 13 wherein said control means further comprises:
fourth means responsive to the first binary control signal and to the second clock signal for precisely developing a digital representation of the amplitude of the input analog current.

* * * * *